United States Patent [19]

Sheng et al.

[11] 4,134,778
[45] Jan. 16, 1979

[54] SELECTIVE IRRADIATION OF THYRISTORS

[75] Inventors: William W. Sheng, Auburn; Y. S. Edmund Sun, Liverpool; Edward G. Tefft, Auburn, all of N.Y.

[73] Assignee: General Electric Company, Auburn, N.Y.

[21] Appl. No.: 830,190

[22] Filed: Sep. 2, 1977

[51] Int. Cl.² .................. H01L 21/263; H01L 7/54; H01L 21/22
[52] U.S. Cl. ........................ 148/1.5; 148/187; 357/39; 91
[58] Field of Search ............... 148/1.5; 357/91, 39; 148/187

[56] References Cited

U.S. PATENT DOCUMENTS

| 3,442,722 | 5/1969 | Bäuerlein et al. | 148/178 |
| 3,864,174 | 2/1975 | Akiyama et al. | 148/1.5 |
| 3,877,997 | 4/1975 | Brown | 148/1.5 |
| 3,881,963 | 5/1975 | Chu et al. | 148/1.5 |
| 3,881,964 | 5/1975 | Cresswell et al. | 148/1.5 |
| 3,888,701 | 6/1975 | Tarneja et al. | 148/1.5 |
| 3,933,527 | 1/1976 | Tarneja et al. | 148/1.5 |
| 3,943,013 | 3/1976 | Kennedy et al. | 148/187 |
| 4,043,837 | 8/1977 | Cresswell et al. | 148/1.5 |
| 4,047,976 | 9/1977 | Bledsoe et al. | 148/1.5 |
| 4,056,408 | 11/1977 | Bartko et al. | 148/1.5 |

OTHER PUBLICATIONS

Rai-Choudhary et al., "Electron Irradiation . . . in Si . . .".,  IEEE Trans. Electr. Device, ED-23 (1976) 814.

Primary Examiner—L. Dewayne Rutledge
Assistant Examiner—Upendra Roy
Attorney, Agent, or Firm—R. J. Mooney; S. B. Salai

[57] ABSTRACT

The dv/dt characteristics of a bidirectional thyristor are improved by irradiating selected portions of the device with high energy crystal lattice-damaging particles. In an exemplary embodiment, the commutating dv/dt of a triac is enhanced by the masked, selective irradiation of the boundaries between conducting portions and between the gate and the conducting portions.

26 Claims, 6 Drawing Figures

SELECTIVE IRRADIATION OF THYRISTORS

This invention relates in general to bidirectional thyristors and more particularly to a method for improving certain electrical characteristics of bidirectional thyristors by irradiating selected portions of such thyristors with semiconductor crystal lattice-damaging high energy particles.

One of the important characteristics of thyristors is the dv/dt capability thereof. The dv/dt capability of a thyristor includes the static dv/dt, reapplied dv/dt, and commutating dv/dt. It is known in the art that the dv/dt of thyristors may be modified by modifying the carrier lifetime in the base region of the device. In accordance with the prior art, the dv/dt of thyristors has been improved by the introduction of gold or platinum into all or part of the device, for example by diffusion. See, for example, U.S. Pat. No. 3,943,013 (Kennedy, et al.). While the foregoing patent describes a device and a method for the fabrication thereof which provides certain advantages over theretofore existing devices, it is nevertheless oftentimes desirable to modify the characteristics of a thyristor after the manufacture of the device has been substantially completed and such characteristics have been identified by preliminary testing. Further, gold doping is a difficult process to control precisely in order to achieve the desired results. Insofar as the commutating dv/dt of a device, for example, may be adequately tested only after the device is substantially completed and the electrodes have been formed thereon, it is too late at that point to improve the commutating dv/dt of devices which fail to meet the specification by the selective diffusion of gold as described in the foregoing patent. It is precisely at that point, however, the investment in the device having reached substantially the ultimate investment, that modification of the dv/dt characteristics of devices which fall below specification would be most desirable. Clearly, devices may thereby be produced fully meeting specifications that would otherwise be rejected and, therefore, either rendered useless or relegated to inferior ratings.

Accordingly, it is an object of this invention to provide a method for modifying the commutating dv/dt of a thyristor without requiring a diffusion or other similarly elevated temperature processing step incompatible with the substantially finished character of the device at the time of test.

It is another object of this invention to provide a post-diffusion treatment method for modifying the characteristics of a thyristor which method may be accurately controlled so as to provide only the amount of modification necessary to increase the dv/dt capability of the device to bring it within desired specifications.

It is yet another object of this invention to provide an improved method for improving the electrical characteristics of a thyristor which method is readily and inexpensively performed and is adaptable to a wide variety of particular thyristor types.

Briefly stated and in accordance with one aspect of this invention, a method for the selective irradiation of thyristors comprises providing a thyristor which may conveniently be a substantially completed device, that is to say, a device to which conductive electrical contacts have been affixed; and, selectively irradiating certain portions of the device with relatively high energy, lattice-damaging radiation which may preferably be electron bombardment. In accordance with a presently preferred aspect of this invention, selective irradiation is accomplished by shielding that portion of the thyristor device not desired to be irradiated. Shielding may be accomplished, for example, by providing a shielding material between the source of radiation and those portions of the device which are not desired to be irradiated. The shielding material must be of a thickness and composition such that substantially no particles pass therethrough which are sufficiently energetic to cause lattice damage. Specifically, a mask may be employed which is characterized by a first thickness in those areas where lattice defect causing irradiation is desired, and, a second, greater thickness in those areas where no irradiation is desired.

In accordance with a presently preferred embodiment of this invention wherein a thyristor is provided having first and second main current carrying areas which lie on either side of a boundary running therebetween. Irradiation, essentially only in the boundary region, is performed for greatly increasing the commutating dv/dt of the device.

In accordance with another aspect of this invention wherein first and second main current carrying regions are provided, separated one from the other by a common boundary running therebetween, and, wherein additionally, a gate region is provided which is separated from both said first and said second main current carrying regions by a second boundary, both said first and second boundaries are irradiated for increasing the dv/dt rating of the device.

It is a feature of this invention that irradiation of the devices may be performed after the application of contacts thereto. In fact, in accordance with one aspect of this invention, the contacts of the device which essentially overlie the first and second main current carrying regions and gate region of the device are prepared by the application of high lead solder thereto, to act as an irradiation mask. In this way, the necessity for a separate mask is eliminated.

In accordance with one aspect of this invention, irradiation may be employed as a remedial method to bring within specifications certain thyristors which are determined after the application of contacts thereto to be below an established minimum dv/dt characteristic. Utilizing this invention, therefore, devices may be improved to provide fully operational devices within pre-established specifications which devices might otherwise have been scrapped.

In accordance with yet another aspect of this invention, devices may be provided which exceed the otherwise obtainable characteristic trade-off between gate trigger current ($I_{Gt}$) and commutating dv/dt. In accordance with a presently preferred aspect of this invention, commutating dv/dt may be improved without degrading $I_{Gt}$ through the use of carefully chosen irradiation energy levels and dosages. It is to be expected that a normal distribution of device characteristics produced through the processing steps which precede the steps in accordance with this invention will produce a number of devices which although the dv/dt characteristics thereof are below specifications, nevertheless, have desirably low $I_{Gt}$. These devices may advantageously be treated in accordance with the teaching of this invention to provide devices which have the oftentimes desirable combination of low $I_{Gt}$ and high commutating dv/dt.

In accordance with a still further aspect of this invention, devices which, after processing in accordance with the prior art, have normal $I_{Gt}$ and normal commutating dv/dt characteristics may be processed in accordance with the teachings herewith to provide normal $I_{Gt}$ and higher than normal commutating dv/dt characteristics.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
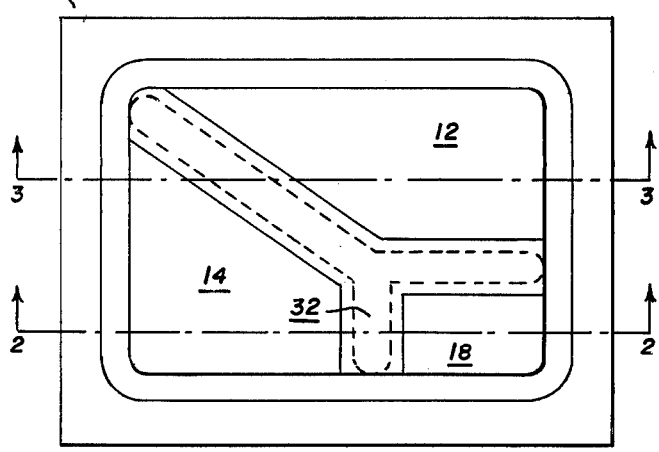
FIG. 1 is a top view of a thyristor of the type to which this invention may be beneficially applied.
Figure 2:
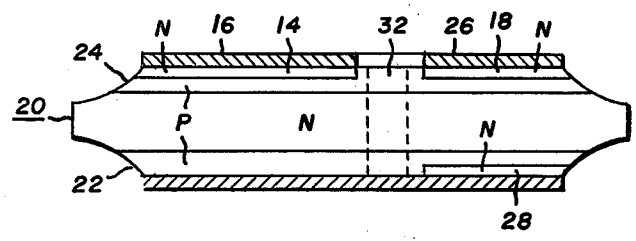
FIGS. 2 and 3 are section views of the device of FIG. 1.
Figure 3:
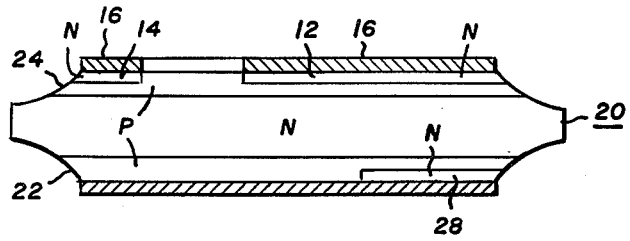

Referring now to FIG. 1, a thyristor indicated generally at 10 includes first and second main current carrying portions 12 and 14. Conveniently, current carrying portion 12 is of p-conductivity type semiconductor material while current carrying portion 14 is of n-conductivity type material. It will be understood by those skilled in the art that thyristor 10 conventionally includes an electrode 16 which is illustrated in FIGS. 2 and 3 but which is omitted from FIG. 1 in order to show current carrying regions 12 and 14. Thyristor 10 further includes gate region 18, also of n-conductivity type semiconductor material.

Referring now to FIG. 2, thyristor 10 may conveniently be formed in a wafer of semiconductor material 20 of n-coductivity type. P-conductivity type regions 22 and 24 are conveniently formed by diffusion from an impurity source into wafer 20. Subsequently, n-conductivity type regions 14 and 28 along with gate region 18 are similarly formed. Electrode 26 provides ohmic contact to gate region 18. Main current portions 12 and 14 are laterally spaced apart and separated one from the other by boundary region 30 which is indicated in phantom in FIG. 1. SImilarly, regions 12 and 14 are separated from gate region 18 by second boundary region 32 which is likewise indicated in phantom in FIG. 1. Thyristor 10 of FIGS. 1, 2, and 3 is conventionally formed as one of a number of such devices on a large semiconductor wafer. After formation, the wafer is divided into a number of semiconductor pellets for individual packaging. While only a single pellet is illustrated in the drawing, it will be understood by those skilled in the art that the processes described herein are preferably performed on the semiconductor before the division thereof into individual devices. In that way, a large number of devices having substantially identical processing histories may be fabricated at one time and may receive the benefits in accordance with this invention at an extremely low cost.

While the diffusion of gold or a similar impurity into the boundary region or regions of a device as indicated in FIG. 1 has been suggested by the prior art, several difficulties attach to the gold diffusion process. First, a diffusion may not generally be performed after the formation of metal contacts on the device. This is due to the elevated temperatures which are typically required not only for the diffusion process itself, but for the growth of an oxide layer as is typically employed for masking selective diffusion. Secondly, gold diffuses into silicon devices at an extremely rapid rate and does so, as is well known, not only vertically but also laterally. For this reason, the selective diffusion of gold in the boundary retions of a device results in the reduction of lifetime not only in the desired regions, but also in a part of the device wherein lifetime reduction is not desired and, in fact, is detrimental. This causes an increase in forward voltage drop of the device and a decrease in gate sensitivity. Selective irradiation substantially overcomes these difficulties. Irradiation is employed in accordance with the teachings hereof to provide for the reduction of lifetime in an area which is essentially vertical and which does not substantially affect laterally adjacent areas. For this reason, those parameters of the device which were adversely affected by diffusion of lifetime-killing impurities (forward voltage drop and gate sensitivity) are not adversely affected by electron irradiation. Further, irradiation may be performed in substantially fewer additional steps than the selective diffusion of a lifetime killing impurity and at correspondingly reduced cost. Still further, electron irradiation may be performed after preliminary testing of the device which may occur only after electrical contacts have been formed thereon. In this way, irradiation may be applied only to those devices which will benefit thereby at an even further decrease in cost which is increasingly important where a large number of devices are being fabricated.

In accordance with the teachings of this invention, electron irradiation is employed primarily to improve the commutating dv/dt of a thyristor. As is well known, when a thyristor is employed in an alternating current application, the two conducting portions of the device — those portions which are substantially coextensive with regions 12 and 14 of FIG. 1 and portions of the device thereunder — are in alternating conducting and voltage blocking states. As one conducting section switches off and the other switches on, it is desirable to minimize, to the extent possible, the effect of one current-carrying region on another. In the worst case, where one portion of the device switches rapidly, enough charge will spill over to the other portion of the device to prematurely turn it on. This effect, of which commutating dv/dt is a measure, reduces the speed at at which the device may operate and consequently the effective frequency limitation thereof. In order to increase the commutating dv/dt capability of the device to provide a faster device and one which may operate at a high frequency, the interaction between thyristor sections must be reduced. To this end, the lifetime in the boundary region between current carrying portions of the thyristor is reduced by the irradiation of the boundary region by lattice damaging radiation.

While irradiation of the entire device will have the desired effect on commutating dv/dt, it will also produce the undesired effects of raising the forward voltage drop and decreasing the gate sensitivity. Accordingly, this invention prefers to irradiate essentially only the boundary region between current-carrying portions of the device and the boundary region surrounding the gate portion of the device, isolating the gate from the main current carrying regions. It will be understood by those skilled in the art that while selective irradiation is preferred in accordance with this invention, where the reduction in gate sensitivity and the increase in the forward voltage drop are acceptable, overall irradiation may provide certain economies while still retaining enhanced controllability over gold diffusion.

Figure 4:
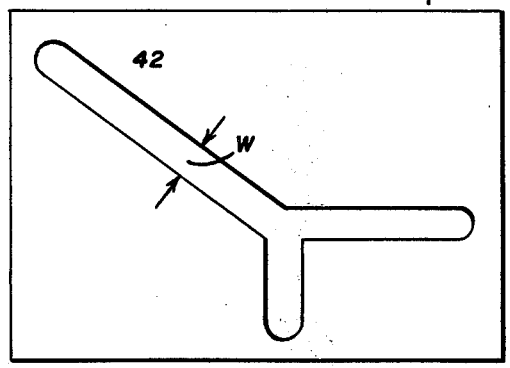
FIG. 4 is a top view of a mask usefully employed in accordance with this invention.
Figure 5:
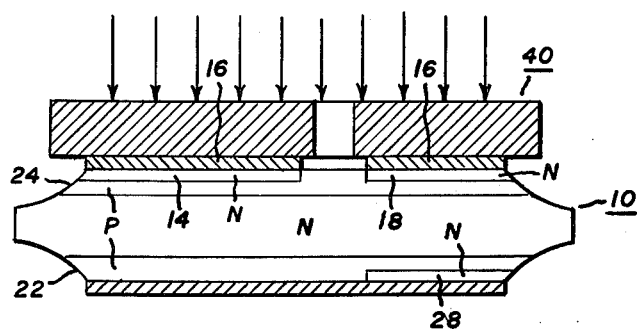
FIG. 5 is a section view of a thyristor and mask as employed during irradiation and in accordance with the teachings of this invention.

FIG. 4 is a top view of a mask which may be utilized in accordance with this invention for providing selective irradiation of only the boundary regions of a thyristor. The mask, indicated generally at 40, includes an opening 42 therein which is essentially coextensive with boundary regions 30 and 32 as illustrated in FIG. 1. Mask 40 may be formed of any of a number of materials which have the property of reducing the energy of particles which pass therethrough. Conveniently, any of a number of readily available material such as lead molybdenum, and the like, may be employed. It is preferred, in accordance with this invention, to provide a mask which is as thin as possible so as to facilitate the easy formation therein of opening 42 having a width W which is as narrow as possible. Preferably, opening 42 is formed by chemical etching of mask 40, and it may generally be stated that the thickness of the masking material is a lower limit on the width of the opening. It is preferable, in accordance with this invention, that the opening be as narrow as possible so as to minimize the deleterious affects of irradiation on forward voltage drop and gate sensitivity.

In accordance with a preferred embodiment of this invention, a mask of molybdenum having a thickness of about six mils may be advantageously employed. Where thicker masks are required, it may be preferred to utilize, in combination, two or more relatively thin masks in order to most effectively reduce the cost of fabricating the masks. It will be understood that while the mask as hereinabove described may be beneficially employed, any method for forming masks known to those skilled in the art may equally well be employed without departing from the true spirit and scope of this invention.

Figure 6:
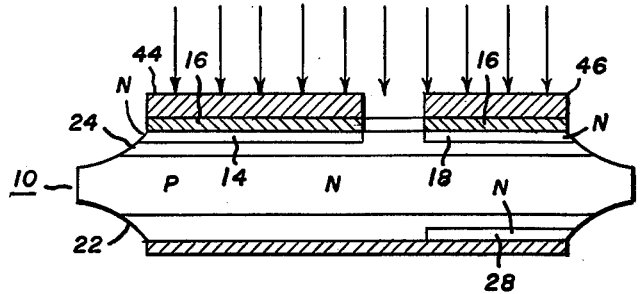
FIG. 6 is a section view of a thyristor wherein high lead solder masking is employed in accordance with the teachings of this invention.

FIG. 6 illustrates, in combination, mask 40 and semiconductor device 10. As was hereinabove described, in accordance with a preferred method of this invention, mask 40 is but a representative portion of a larger mask designed to cover an entire semiconductor or wafer including a plurality of thyristors formed thereon.

Many types of lattice-damaging, high energy irradiation may be employed in accordance with this invention. Electron irradiation is to be preferred insofar as it is readily provided and relatively inexpensive. Neutron and $\gamma$ irradiation are also capable of providing the requisite lattice damage although $\gamma$ irradiation is difficult to mask in order to provide the selective irradiation desirable in accordance with one aspect of this invention and does not result in a substantial amount of lattice damage within a device. Proton irradiation may also be applied, but very high energies are needed in order to obtain adequate penetration depth.

The energy of the irradiation source to some extent depends upon the type of irradiation employed and determines to a great degree the type of masking required. It is preferred in accordance with this invention that the areas of the thyristor which are not desired to be irradiated be subjected to electron irradiation of, for example, no more than 300 KeV energy. It has been determined that electrons having energies of 300 KeV or lower produce substantially no lattice damage as compared to electrons having energies of about 400 to 500 KeV and greater. The energy level of the electron irradiation source is to some extent determined by the type of masking employed. Where masking is employed, as has been hereinabove described utilizing six mil thick molybdenum masking material, the energy loss in the mask is on the order of 200 KeV. The amount of energy which may be expected to be lost in passing through a mask utilized in accordance with this invention may be determined by reference to the following equation:

$$dE/dx = K(E,Z)ZN\phi_0$$

wherein $dE/dx$ is the change in energy over distance measured in MeV/cm, K is a relatively constant function of the energy and the element which may be determined, for example, by reference to Corbett, J. W., in "Radiation Effect in Metals and Semiconductors", *Solid State Physics Supplment* 7, Academic Press, 1966, Z is the atomic number of the element, N is the number of atoms per $cm^3$, and $\phi_0$ is equal to about $6.6 \times 10^{-25}$ $cm^2$.

It is desirable in accordance with this invention that the difference in the damage coefficient for the radiation impinging upon the mask and unmasked portions of the device selectively irradiated in accordance with this invention be on the order of 10. The damage coefficient is related to the energy of the particles and is nonlinear. Where, for example, electrons having an energy of 400 KeV are utilized, a difference in damage coefficient of approximately 20 is obtained by reducing the energy in the masked portion of the device of 300 KeV. Similarly, the ratio of the damage coefficients for electrons having energies of 500 and 400 KeV is three. In accordance with a presently preferred embodiment of this invention, a mask is employed of molybdenum having a thickness of 6 mils. Irradiation is accomplished using 500 KeV electrons which pass unimpeded to the area desired to be irradiated and which electrons are attenuated to about 300 KeV in the masked portion. It will be appreciated that a difference in damage coefficient of about sixty (60) is obtained. Clearly, higher energy irradiation may be employed, with the resulting savings in time of irradiation, only if relatively thicker masks are employed. For the reasons hereinabove described, it is desirable to be able to use as thin a mask as possible in order to facilitate the fabrication thereof.

The time of irradiation depends of course upon the magnitude of flux. The flux is proportional to the beam current. Where high currents are utilized, the time of irradiation may be shortened. The degree of change in lifetime may be determined from:

$$1/t = 1/t_0 + K\phi$$

wherein t is the lifetime after irradiation, $t_0$ is the initial lifetime, K is the damage coefficient, and $\phi$ is the flux of $e/cm^2$. Where extremely high levels of flux are employed, it is oftentimes desirable to scan the electron beam over the masked wafer in order to prevent heating of the wafer beyond a desired temperature.

Referring back now to the equation relating to flux and lifetime, it is desirable that in the masked area $1/t_0 > K\phi$, while in the unmasked area $1/t_0$ is $< K\phi$. A relatively wide range of dosage may usefully be employed in accordance with this invention. Typically, dosages between 2 and 10 megarad may be employed with dosages on the order of 4 megarad being preferred. These dosages may be readily obtained utilizing available irradiation techniques in times well under an hour.

Where the time span for irradiating the devices is not important, lower currents may be utilized with corresponding increases in the time of irradiation.

FIG. 6 illustrates the application of high lead solder to device 10 for self-masking against irradiation. Since the area of the contact metallization on regions 12, 14, and 18, corresponds essentially to those areas desired to be masked against the effect of defect-causing irradiation, it may be convenient to utilize those contacts as a mask. Typically, the contacts themselves are of insufficient thickness to provide the necessary decrease in energy for successful selective irradiation. Accordingly, a layer of solder which is preferably high lead solder is applied to the contacts and the device is then irradiated. Solder layers 44 and 46 are applied to electrodes 16 and 26, respectively. The thickness of solder layers 44 and 46 may be determined by reference to the relationship hereinabove described for the attenuation of electron beams.

While this invention has been described in conjunction with several preferred embodiments thereof, certain modifications and changes may be made without departing from t the true spirit and scope of the invention. For example, certain preferred ranges of energies and dosages have been set forth. It will be understood that within a fairly wide range, for example, from 0.4 to 12 MeV, masked selective irradiation may advantageously be performed. Further, wherein irradiation is desired both in the boundary region and the current carrying region, and where, further, it is desired to irradiate finished packaged devices, even higher energies up to 25 MeV or more may be employed.

Where selective irradiation in accordance with this invention is utilized to modify the characteristics of thyristors which have been rejected, it is convenient to test one or more devices on a semiconductor wafer and to selectively irradiate the entire wafer based on this sampling of devices where low commutating dv/dt is evident.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for improving the characteristics of bi-directional semiconductor switches of the type including a first current conducting region for conducting in a first direction, a second current conducting region for conducting in a second direction opposite said first direction, said second current conducting region laterally spaced apart from said first current conducting region and forming a first boundary therebetween, and a gate region spaced apart from and having a common boundary with both said first and said second current conducting regions, said method comprising:
   selectively irradiating said first boundary to form lifetime reducing defects therealong.

2. The method of claim 1 wherein said irradiating comprises irradiating said first boundary with electrons at an energy in excess of 400 KeV.

3. The method of claim 1 wherein said selectively irradiating comprises masking essentially all of the said switches except for said first boundary, and exposing said masked switches to defect-creating irradiation.

4. The method of claim 1 further comprising irradiating said common boundary to form lifetime reducing defects therealong.

5. The method of claim 2 wherein said irradiating comprises irradiating said boundary at an energy between 400 KeV and 12 MeV.

6. The method of claim 5 wherein said irradiating comprises irradiating said boundary to a dosage of between about $10^{12}$ and $10^{15}$ e/cm$^2$.

7. The method of claim 3 wherein said irradiating comprises irradiating said switches where the electrons have an energy in excess of 400 KeV.

8. The method of claim 7 wherein said irradiating comprises irradiating said switches with electrons having energies between about 400 KeV and 12 MeV.

9. The method of claim 8 wherein said irradiating comprises irradiating to a dosage between about $10^{12}$ and $10^{15}$ e/cm$^2$.

10. The method of claim 4 wherein said irradiating comprises irradiating with electrons having an energy in excess of about 400 KeV.

11. The method of claim 4 wherein said selectively irradiating comprises masking essentially all of said semiconductor switches except for said first boundary and said common boundary, and
   exposing said masked switches to a source of irradiation for forming defects along said first boundary and along said common boundary.

12. The method of claim 10 wherein said irradiating comprises irradiating with electrons having an energy between about 400 KeV and 12 MeV.

13. The method of claim 12 wherein said irradiating comprises irradiating to a dosage of between about $10^{12}$ and $10^{15}$ e/cm$^2$.

14. The method of claim 11 wherein said irradiating comprises irradiating with electrons having an energy in excess of 400 KeV.

15. The method of claim 14 wherein said irradiating comprises irradiating with electrons having an energy between about 400 KeV and 12 MeV.

16. The method of claim 15 wherein said irradiating comprises irradiating to a dosage of between about $10^{12}$ and $10^{15}$ e/cm$^2$.

17. A method for improving the electrical characteristics of bi-directional thyristors of the type including first and second laterally spaced apart current carrying regions in a single semiconductor body separated by a first boundary region, each said first and second regions having first, second, third, and fourth alternating conductivity type layers therein, at least one of said layers comprising a base layer and first and second electrodes for providing ohmic contact to said regions, said method comprising:
   irradiating said boundary region with semiconductor crystal lattice-damaging high energy particles for forming additional charge carrier recombination sites at least in said base layer in said boundary region.

18. The method of claim 17 wherein said particles comprise electrons.

19. The method of claim 18 wherein said electrons comprise electrons having energies in excess of 400 KeV.

20. The method of claim 19 wherein said thyristors further include a first gate region including a first gate electrode thereon separated from said first and second current carrying regions by a second boundary region and said method further comprises irradiating said second boundary region with crystal lattice damaging electrons having energies in excess of 400 KeV.

21. The method of claim 19 wherein said thyristors comprise triacs and said irradiating comprises:
   masking said first and second current carrying regions; and
   irradiating said triac with lattice damaging high energy particles so that essentially only said first boundary is impacted by said particles.

22. The method of claim 20 wherein said thyristors comprise triacs and said irradiating comprises:
   masking said first and second current carrying regions and said gate region; and
   irradiating said triac so that essentially only said first and said second boundary regions are impacted by said high energy electrons.

23. The method of claim 21 wherein said masking step comprises:
coating said first and second electrodes with high lead solder.

24. The method of claim 21 wherein said masking comprises covering said first and second current carrying regions with a shield of sufficient thickness to effectively prevent particles having sufficient energy to cause lattice damage from reaching said current carrying regions.

25. The method of claim 22 wherein said masking step comprises coating said first and second electrodes and said first gate electrodes with high lead solder.

26. The method of claim 22 wherein said masking comprises covering said first and second current carrying regions and said gate region with a shield of sufficient thickness to effectively prevent particles having sufficient energy to cause lattice damage from reaching said current carrying regions or said gate regions.

* * * * *